Sept. 1, 1959 L. H. ROWLEY ET AL 2,902,547

TRANSISTOR CONTROLLED MAGNETIC AMPLIFIER

Filed Dec. 1, 1954

INVENTORS
LOTHAIR H. ROWLEY
HERMANE MILENBACH
BY
Victor D. Borst
ATTORNEY 2,902,547
Patented Sept. 1, 1959

2,902,547

TRANSISTOR CONTROLLED MAGNETIC AMPLIFIER

Lothair H. Rowley, Syosset, and Hermane Milenbach, New York, N.Y., assignors to Sperry Rand Corporation, a corporation of Delaware Application December 1, 1954, Serial No. 472,382

3 Claims. (Cl. 179—171)

This invention relates to a magnetic amplifier circuit which employs preamplification means to provide a high input impedance in the signal circuit for the purpose of limiting the current therein and protecting the signal source against excessive drain.

The typical bridge type magnetic amplifier circuit has a comparatively low input impedance which results in an excessive current and power drain on a high impedance source. Frequently the gain has not been high enough to meet amplifier requirements. Various expedients have been adopted to increase the power gain for the particular application desired. Magnetic and vacuum tube preamplifiers have been used before the output stage. Magnetic preamplifiers have low impedance and thus tend to overload the signal source. Additionally, they insert a time delay in the signal circuit. Vacuum tube preamplifiers have the disadvantage of being vulnerable to shocks and vibration. Transistor preamplifiers have been proposed for the output stage to eliminate the magnetic amplifier circuitry with its low input impedance, but such circuit arrangements call for transistors capable of handling large amounts of power, and an extra magnetic amplifier stage to produce the desired power gain.

The advantages of inserting transistor units in the control circuit are numerous. They provide adequate gain in power, current, or voltage, with extremely low power dissipation. They can provide a high impedance load for the signal source and make possible a low impedance control of the magnetic amplifier. The time delay between signal and output is insignificant.

The particular magnetic amplifier circuit shown operates the load on alternate half-cycles of line current. The high impedance transistors are employed to precondition the magnetic circuit cores on the non-conducting half-cycles for either high or low impedance on the conducting half-cycle. The preconditioning current is supplied by the signal controlled transistors which are powered by batteries or by bias resistors placed in parallel across the line and poled oppositely to the main reactor circuits.

The objects and advantages of the transistor amplifier circuit should appear from the following detailed description when taken together with the accompanying drawings in which.

Figure 1:
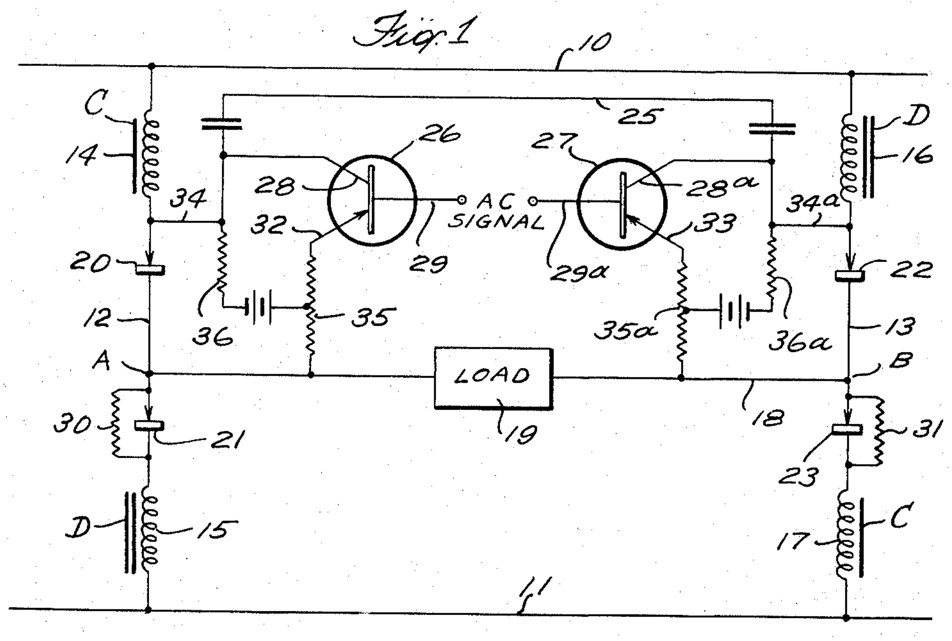
Fig. 1 shows a circuit arrangement of a magnetic amplifier with a transistor control.

According to Fig. 1 the numerals 10 and 11 are used to designate the line connections for a 60 cycle alternating current source. A pair of parallel branch circuits 12 and 13 are placed across the line having reactor windings 14, 15 and 16 and 17, respectively, inserted therein and arranged on saturable cores. The windings 14 and 17 are arranged on a single core C while the windings 15 and 16 are disposed on a second core D. The units 15 and 17 may be any form of the inductive or resistive impedance device instead of reactor windings.

A load circuit 18 connects the branch circuits 12 and 13 at points A and B. A servo motor 19 is inserted in the load circuit being driven thereby. Similarly poled half-wave rectifiers 20 and 21 are disposed in circuit 12 on each side of the load circuit connection. Also half-wave rectifiers 22 and 23 are placed in branch circuit 13 on each side of the load circuit connection and are poled in the same direction as rectifiers 20 and 21.

Collector circuit 25 includes two transistors 26 and 27 having collectors 28 and 28*a*, base leads 29 and 29*a*, respectively, and the signal source which is a comparatively high impedance 60 cycle source. The transistors are point contact types and are connected grounded collectors, presenting a high impedance load to the signal source and should be sensitive to less than .4 ma. of control current. The emitter electrodes 32 and 33 of the transistors are biased by virtue of their connection with the positive terminals of the batteries through resistor 35 while the collector electrodes 28 and 28*a* are connected to the negative terminals of the batteries through the resistors 36 and 36*a*.

The reactor windings 14 and 16 total about 4000 turns per core and therefore have sufficient control over the flux levels in the cores for the particular cores considered, in accordance with standard magnetic amplifier techniques, for very small currents. The impedances of the cores are established on the non-conducting half-cycles of the rectifiers by means of the relative amounts of back-current in the reactor windings for each core. The relative impedances in the two circuits are controlled by varying the amount of back-current around the rectifiers since the amplifier is extremely sensitive to the changes in back-current. The back current flows in the reverse direction through the reactor windings on the non-conducting half cycle of the amplifier. A path for the back-current in the branch circuits 12 and 13 is, respectively, provided by resistors 30 and 31, which shunt half-wave rectifiers 21 and 23, respectively, resistors 35 and 35*a*, the batteries, the resistors 36 and 36*a*, leads 34 and 34*a* and reactor windings 14 and 16. The low impedance, collector circuit is connected to the branch circuits by leads 34 and 34*a* at points in the branch circuits between the rectifiers and the reactor windings. The transistors are thus employed to furnish core biasing current on the non-conducting half-cycle. The transistors are controlled by the signal to conduct either a larger or smaller amount of biasing current, and hence the cores are set on the off half cycle respectively for either high or low impedances for the conducting half-cycle of line current. The push-pull connection of the two transistors accounts for this control. Separately connecting the two base leads 29 and 29*a*, respectively, to the two sides of the signal assures that on each half-cycle of signal current one of the collectors will be biased with a moderately large negative voltage relative to the base and will have relatively high collector impedance. Consequently the collector current flows through a high impedance on both half-cycles and the high impedance of the signal source is matched in the collector circuit. Also the emitter to collector biasing current, which is induced by the back current, is reduced on the high impedance side of the load. On the other hand the emitter circuits to which the back current line is connected are of relatively low impedance thus accounting for the low impedance control of the magnetic amplifier.

Figure 2:
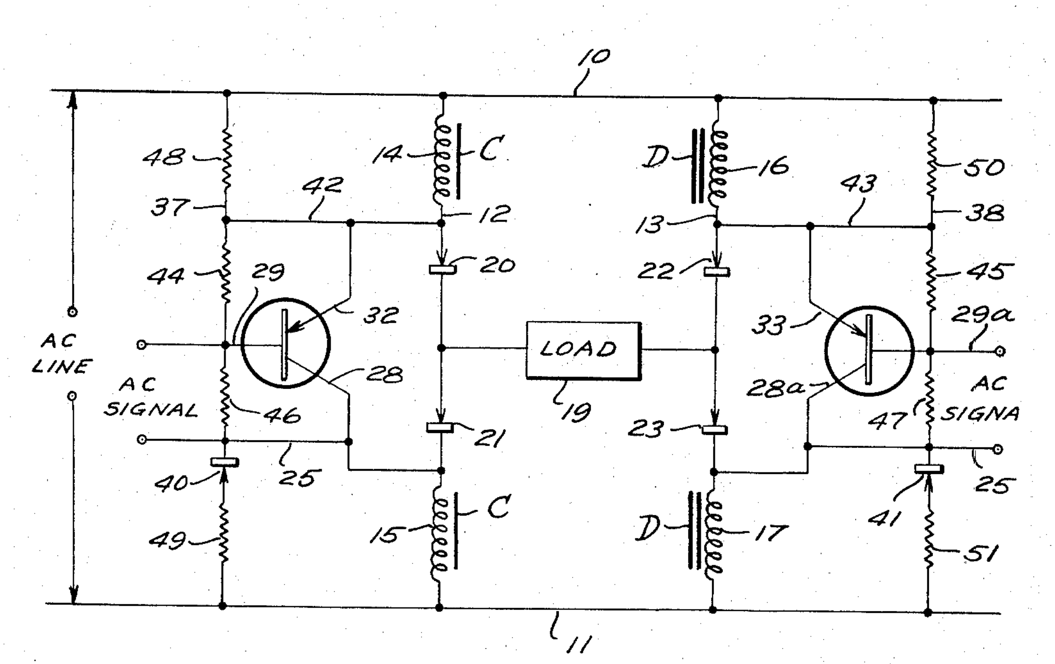
Fig. 2 shows an alternative arrangement of a transistor controlled magnetic amplifier circuit which dispenses with the need of batteries in the signal circuit.

The transistor circuits may be powered by the rectified line current as indicated in Fig. 2. Power circuits 37 and 38 are placed in parallel across the line and are poled by rectifiers 40 and 41, respectively, in a direction opposite to branch circuits 12 and 13. The power circuits 37 and 38 are sufficiently resistive so that the A.-C. line supplies the right amount of rectified current to the emitter or input circuits. Leads 42 and 43 connecting power circuit 37 and branch circuit 12 and power circuit 38 and branch circuit 13, respectively, provide the input power to the emitter circuit in place of batteries and connect the emitters to the base leads to complete the emitter circuit. As previously explained the transistor emitter to collector circuit through the transistor provides a shunt path for the rectifiers in the branch circuits to permit the back-current to flow on the non-conducting half-cycle of line current. It is, therefore, apparent that on the non-conducting half cycle, the flux level in the cores C and D is determined by the emitter to collector biasing current which is induced by the back current and controlled by the signal while on the succeeding half cycle of line current the flux is altered from the bias level by the combination line and signal currents through reactor windings.

The resistances 44 and 45 provide the voltage bias in the emitter circuits and resistances 46 and 47 furnish voltage to the collector circuits. Resistors 48 and 49 in lead 37 and resistors 50 and 51 in lead 38 serve to reduce the line current in the leads.

The invention is not limited to the particular circuit arrangement for the magnetic amplifier above described but is directed especially to the transistor controls in the signal circuit for the amplifier, being defined by the following claims.

What is claimed is:

1. A transistor controlled magnetic amplifier circuit comprising an alternating current supply line, a reactor winding connected to one side of said supply line and wound on a first saturable magnetic core, a second reactor winding connected to said one side of the supply line and wound on a second saturable magnetic core, an inductive impedance device in series with the first mentioned reactor winding and wound on said second magnetic core, a second inductive impedance device in series with said second mentioned reactor winding and wound on said first magnetic core, said inductive impedance devices being connected to the other side of said supply line, a load circuit connected to the series connections at points between said reactor windings and impedance devices, a half wave rectifier in the series connections and disposed on each side of the load connection points, said rectifiers being poled in the same direction, a pair of high input impedance transistors, each of said transistors having a base electrode, a collector electrode and an emitter electrode, a source of electromotive force connected to the emitter and collector electrodes of each transistor, a collector circuit including an alternating signal source, the base electrodes and collector electrodes of said transistors and a line connecting said collector electrodes, the collector electrode of each of said transistors being connected respectively to one of said reactor windings at a point between the said one reactor winding and the rectifier disposed on the same side of the load connection point as the said one reactor winding and the collector and emitter electrodes being connected across the rectifiers disposed on each side of said load connection points whereby an emitter to collector current induced by the back current flowing on the non-conducting half cycle of the magnetic amplifier and controlled by said alternating signal source is adapted to precondition the saturable magnetic cores for the conducting half cycle of line current.

2. A transistor controlled magnetic amplifier circuit as claimed in claim 1 wherein the transistors are grounded collector transistors and the means for connecting said emitter and collector electrodes across the rectifiers includes a rectifier shunt resistor connected to each emitter electrode and a lead connecting each collector electrode to one of said reactor windings in the branch leads.

3. A transmitter controlled magnetic amplifier circuit as claimed in claim 1 wherein said source of electromotive force comprises a pair of parallel branch leads connected across the supply line, half wave rectifiers being provided in each of said branch leads, the rectifiers in said branch leads being poled oppositely to the rectifiers in the series connections of said reactor windings and inductance impedance devices, a resistance in each lead of said pair of branch leads connecting said base and emitter electrodes and a second resistance in each lead of said pair of branch leads connecting said collector and base electrodes whereby said electrodes are adapted to be biased by the supply current on the non-conducting half cycle of the magnetic amplifier.

References Cited in the file of this patent

UNITED STATES PATENTS

| | | |
|---|---|---|
| 2,653,282 | Darling | Sept. 22, 1953 |
| 2,683,853 | Logan | July 13, 1954 |
| 2,770,770 | Lufcy | Nov. 13, 1956 |
| 2,809,343 | Pittman | Oct. 8, 1957 |
| 2,819,352 | Houck | Jan. 7, 1958 |

FOREIGN PATENTS

| | | |
|---|---|---|
| 684,626 | Great Britain | Dec. 24, 1952 |

OTHER REFERENCES

"Electronics," August 1953, pages 136–140, "Transistor Controlled Magnetic Amplifier," by Richard H. Spencer (particularly Figs. 5 and 7).

Radio-Electronic Engineering, February 1954, pages 13–15, "Transistor Control of Magnetic Amplifiers," by Pittman, Jr.